(12) United States Patent
Yu et al.

(10) Patent No.: US 6,514,874 B1
(45) Date of Patent: Feb. 4, 2003

(54) METHOD OF USING CONTROLLED RESIST FOOTING ON SILICON NITRIDE SUBSTRATE FOR SMALLER SPACING OF INTEGRATED CIRCUIT DEVICE FEATURES

(75) Inventors: James Jiahua Yu, Milpitas, CA (US); Bhanwar Singh, Morgan Hill, CA (US); Angela T. Hui, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 3 days.

(21) Appl. No.: 09/875,635

(22) Filed: Jun. 6, 2001

(51) Int. Cl.[7] .............................................. H01L 21/461
(52) U.S. Cl. ........................ 438/744; 438/672; 438/735
(58) Field of Search ................................ 438/714, 724, 438/725, 734, 735, 744, 757, 672; 257/315

(56) References Cited

U.S. PATENT DOCUMENTS 5,989,979 A * 11/1999 Liu et al. ..................... 438/439
6,174,816 B1 * 1/2001 Yin et al. ..................... 438/705

* cited by examiner

*Primary Examiner*—Kamand Cuneo
*Assistant Examiner*—Lisa Kilday
(74) *Attorney, Agent, or Firm*—Foley & Lardner

(57) ABSTRACT

A method of fabricating an integrated circuit can include providing a layer of silicon nitride over a semiconductor substrate where the layer of silicon nitride has a first thickness selected based on a desired size of extensions; providing a layer of photoresist material over the layer of silicon nitride; patterning the layer of photoresist to form photoresist features being separated at the top of the photoresist features by one minimum lithographic feature and etching a portion of the layer of silicon nitride to form a hole for an integrated circuit device feature. The photoresist features include extensions at the bottom of the photoresist features. The extensions define footings. These footings reduce the separation at the bottom of the photoresist features. As such, exposed portions of the layer of silicon nitride are less than one minimum lithographic feature in width.

19 Claims, 2 Drawing Sheets

METHOD OF USING CONTROLLED RESIST FOOTING ON SILICON NITRIDE SUBSTRATE FOR SMALLER SPACING OF INTEGRATED CIRCUIT DEVICE FEATURES

FIELD OF THE INVENTION

The present invention relates generally to the field of integrated circuits and to methods of manufacturing integrated circuits. More particularly, the present invention relates to a method of using controlled resist footing on silicon nitride substrate for smaller spacing of integrated circuit device features.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to put millions of devices on an IC, there is still a need to decrease the size of IC device features, and, thus, increase the number of devices on an IC.

One limitation to the smallness of IC critical dimensions is conventional lithography. In general, projection lithography refers to processes for transferring patterns between various media. According to conventional projection lithography, a silicon slice, the wafer, is coated uniformly with a lithographic coating. The lithographic coating is a radiation-sensitive film or coating (photoresist).

An exposing source of radiation (such as light, x-rays, or an electron beam) illuminates selected areas of the surface through an intervening master template, the mask, containing a particular pattern. The radiation-sensitive coating is generally suitable for receiving a projected image of the subject pattern. Once the image is projected, it is indelibly formed in the coating. The projected image may be either a negative or a positive image of the subject pattern.

The image area becomes selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to projection lithography is EUV lithography. EUV lithography reduces feature size of circuit elements by lithographically imaging them with radiation of a shorter wavelength. "Long" or "soft" x-rays (a.k.a, extreme ultraviolet (EUV)), wavelength range of lambda=50 to 700 angstroms are used in an effort to achieve smaller desired feature sizes.

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Although EUV lithography provides substantial advantages with respect to achieving high resolution patterning, errors may still result from the EUV lithography process. For instance, the reflective reticle employed in the EUV lithographic process is not completely reflective and consequently will absorb some of the EUV radiation. The absorbed EUV radiation results in heating of the reticle. As the reticle increases in temperature, mechanical distortion of the reticle may result due to thermal expansion of the reticle.

Both conventional projection and EUV lithographic processes are limited in their ability to print small features, such as, contacts, trenches, polysilicon lines or gate structures. As such, the critical dimensions of IC device features, and, thus, IC devices, are limited in how small they can be.

Conventional lithography can utilize photoresist materials and anti-reflective coating (ARC) materials to pattern geometric shapes on an integrated circuit. One problem with the use of photoresist and ARC layers is interfacial layer formation. Interfacial layer formation refers to a situation where the components of the photoresist and the ARC become mixed in a narrow zone between the two layers leading to resist footing. "Resist footing" refers to the presence of a small protrusion at the bottom of the resist feature after development. Generally, convention IC designers consider resist footing to complicate line width determination and reduce critical dimension control.

Thus, there is a need to pattern IC devices using non-conventional lithographic techniques. Further, there is a need to form smaller feature sizes, such as, smaller trench lines. Yet further, there is a need for a method of using controlled resist footing on silicon nitride substrate for smaller spacing of integrated circuit device features.

SUMMARY OF THE INVENTION

An exemplary embodiment is related to a method of fabricating an integrated circuit. This method can include providing a layer of silicon nitride over a semiconductor substrate where the layer of silicon nitride has a first thickness selected based on a desired size of extensions; providing a layer of photoresist material over the layer of silicon nitride; patterning the layer of photoresist to form photoresist features being separated at the top of the photoresist features by one minimum lithographic feature; and etching a portion of the layer of silicon nitride to form a hole for an integrated circuit device feature. The photoresist features include extensions at the bottom of the photoresist features. The extensions define footings which reduce the separation at the bottom of the photoresist features. As such, exposed portions of the layer of silicon nitride are less than one minimum lithographic feature in width.

Briefly, another exemplary embodiment is related to a method of forming an integrated circuit device feature. This method can include providing a silicon nitride layer having a thickness selected based on a desired size of extensions; and forming photoresist features over the silicon nitride layer. The photoresist features include extensions and provide a mask for etching the silicon nitride layer at a width which is smaller than one minimum lithographic feature.

Briefly, another embodiment is related to an integrated circuit. This integrated circuit is manufactured by a method that includes providing a layer of silicon nitride over a semiconductor substrate where the layer of silicon nitride has a first thickness selected based on a desired size of extensions; providing a layer of photoresist material over the layer of silicon nitride; patterning the layer of photoresist to form photoresist features being separated at the top of the photoresist features by one minimum lithographic feature; and etching a portion of the layer of silicon nitride to form a hole for an integrated circuit device feature. The photoresist features include extensions at the bottom of the photoresist features. The extensions define footings which reduce the separation at the bottom of the photoresist features. As such, exposed portions of the layer of silicon nitride are less than one minimum lithographic feature in width.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
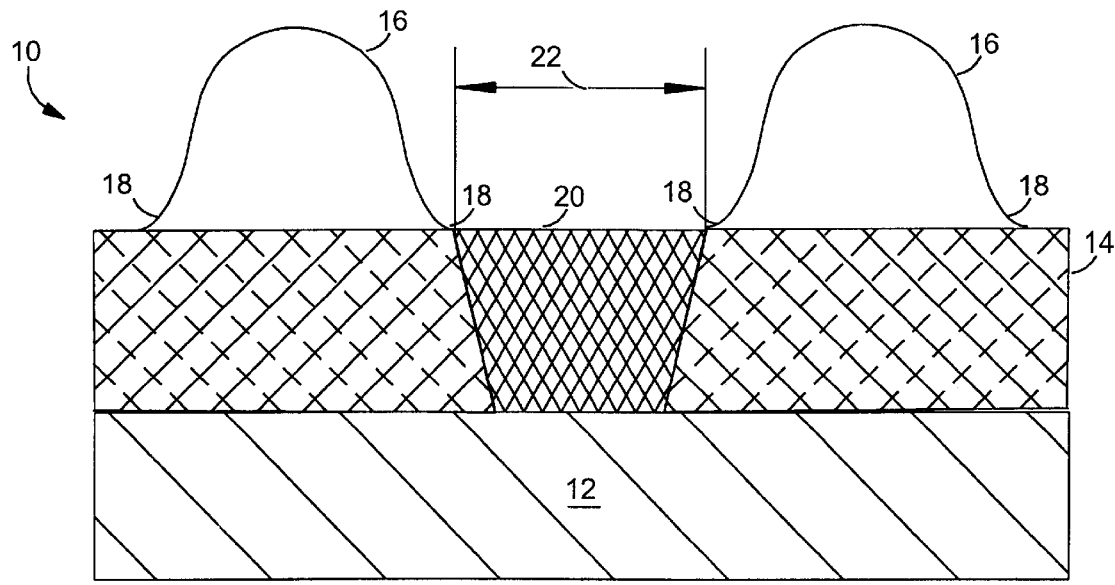
FIG. 1 is a schematic cross-sectional view of a portion of an integrated circuit fabricated in accordance with an exemplary embodiment of the present invention.

Referring to FIG. 1, a cross-sectional view of a portion 10 of an integrated circuit (IC) includes a substrate 12, a silicon nitride layer 14, photoresist features 16, footings 18, and an integrated circuit feature 20. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 is preferably single crystal silicon material. Silicon nitride layer 14 is at least partially silicon nitride ($Si_3N_4$) and can have a variety of thicknesses. Photoresist features 16 can be made of a photoresist material or any anti-reflective material. Footings 18 are formed at the bottom of photoresist features 16 or where photoresist features 16 come in contact with silicon nitride layer 14. The size of footings 18 is a function of the thickness of silicon nitride layer 14. In an exemplary embodiment, silicon nitride layer 14 has a thickness of 5,000 to 12,000 Angstroms. Footings 18 can be 50 to 100 Angstroms in width beyond the width of photoresist features 16.

Advantageously, it is possible to use footings 18 for smaller spacing in the formation of integrated circuit device features. For example, in FIG. 1 photoresist features 16 provide a mask for the etching of silicon nitride layer 14 and the creation of feature 20. Feature 20 has a width 22 which is smaller than the width possible using conventional lithography techniques. Advantageously, the thickness of silicon nitride layer 14 can be used to control the size of footings 18 and make width 22 and, thus, feature 20 smaller. The thicker silicon nitride layer 14 is, the larger footings 18 become and the smaller width 22 will be. One particular advantage of footings 18 is the ability to selectively determine the size of footings 18 and, thus, the size of width 22.

The method of forming portion 10 is described below with reference to FIGS. 1–4. The method advantageously forms portion 10 having integrated circuit device features with small critical dimensions. In exemplary embodiments, IC structures, such as, contacts, gates, or polysilicon line may be manufactured utilizing the method described below.

Figure 2:
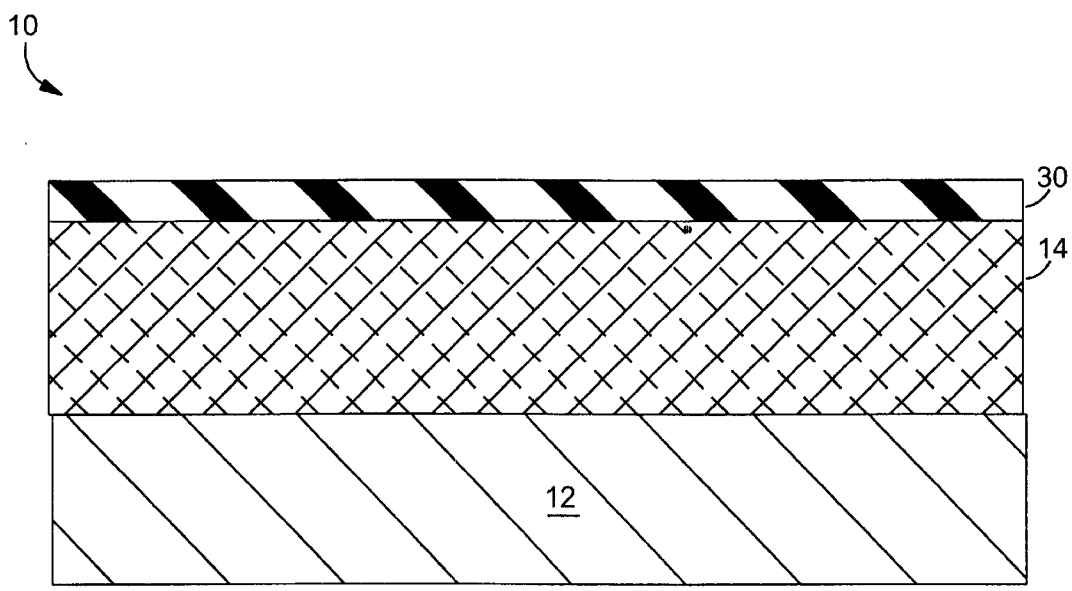
FIG. 2 is a schematic cross-sectional view of a portion of an integrated circuit, showing various layers deposited in an exemplary method of manufacturing the integrated circuit illustrated in FIG. 1.

In FIG. 2, a cross-sectional view of portion 10 illustrates various layers deposited in an exemplary method of fabrication of portion 10. In an exemplary embodiment, substrate 12 has deposited over it silicon nitride layer 14 and a resist layer 30. In one embodiment, silicon nitride layer 14 is 5,000 Angstroms thick and resist layer 30 is 300 to 1,000 Angstroms thick. Alternatively, silicon nitride layer 14 can have a thickness of between 5,000 and 12,000 Angstroms. In alternative embodiments, additional layers may also be present in portion 10.

Figure 3:
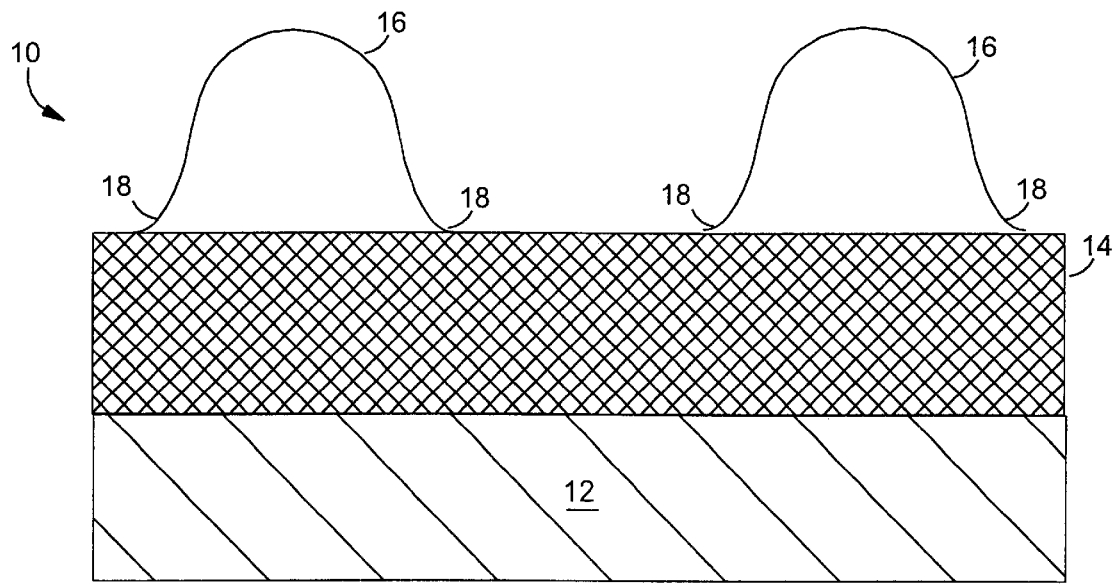
FIG. 3 is a schematic cross-sectional view of a portion of an integrated circuit, showing resist footing used in an exemplary method of manufacturing the integrated circuit illustrated in FIG. 1.

In FIG. 3, a cross-sectional view of portion 10 illustrates resist layer 30 patterned to form resist features 16. In an exemplary embodiment, patterning of resist layer 30 includes a lithographic process with an etching step. In an exemplary embodiment, etching can be done using a plasma etch or a dry etch. As resist features 16 are formed, footings 18 are created due to the presence of silicon nitride layer 14. As mentioned briefly above, the widths of footings 18 are a function of the thickness of silicon nitride layer 14. In an exemplary embodiment, silicon nitride layer 14 is 12,000 Angstroms thick, resulting in footings 18 which are 100 Angstroms wide. Heretofore, the relationship between the thickness of silicon nitride layer and footings has been a disadvantage in the integrated circuit fabrication process. For example, U.S. Pat. Nos. 6,162,586 and 5,989,979 describe methods for preventing or minimizing the formation of footings. Advantageously, footings 18 are used to provide for smaller spacing between integrated circuit device features.

Figure 4:
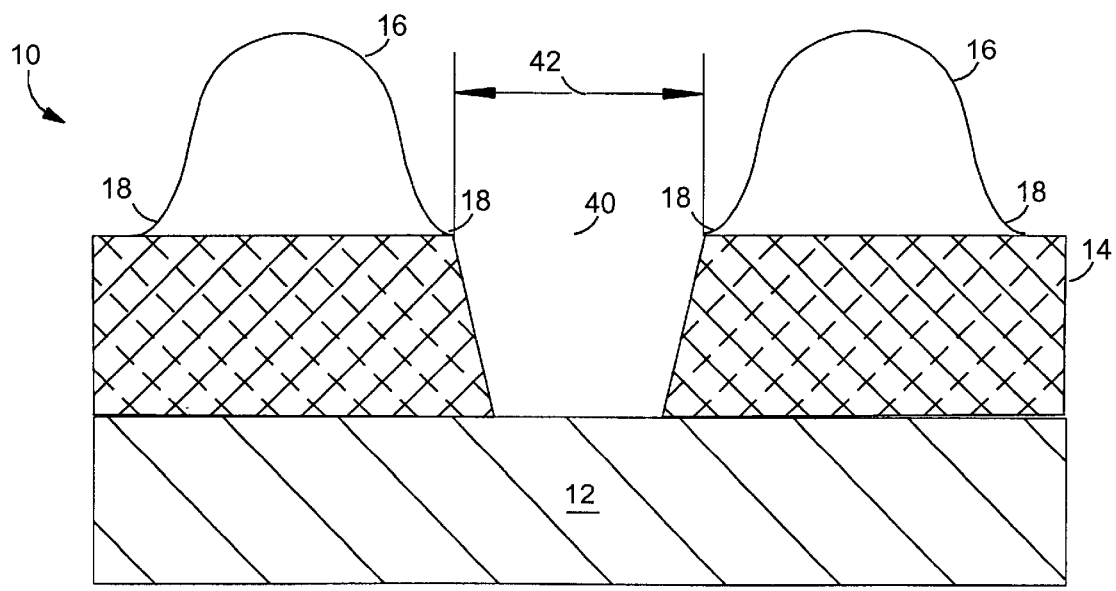
FIG. 4 is a schematic cross-sectional view of a portion of an integrated circuit, showing an etching step used in an exemplary method of manufacturing the integrated circuit illustrated in FIG. 1.

In FIG. 4, a cross-sectional view of portion 10 illustrates etching of silicon nitride layer 14 using resist features 16 and footings 18 as a mask. In an exemplary embodiment, etching can be a plasma etch, a dry etch, or any other of a variety of etching technologies. Advantageously, etching of silicon nitride layer 14 forms an aperture 40 in silicon nitride layer 14 with a width 42 that is smaller than one minimum lithographic feature. Aperture 40 can be filled with conductive material, such as, aluminum to form an integrated circuit gate. Aperture 40 can be filled with insulative material to provide electrical isolation in the IC. Similarly, aperture 40 can be used to form contacts, trench lines, or other integrated circuit features, such as feature 20, described with reference to FIG. 1.

In an exemplary embodiment, lithographic techniques are used to get the smallest feature size distance possible between photoresist features 16. Advantageously, the presence of silicon nitride layer 14 results in footings 18 extending from photoresist features 16, shortening the feature size distance. As such, the method described with reference to FIGS. 1–4 provides for the creation of integrated circuit features which are smaller than those possible using conventional lithographic techniques alone.

While the embodiments illustrated in the FIGURES and described above are presently preferred, it should be understood that these embodiments are offered by way of example only. Other embodiments may include, for example, different methods of patterning or etching various layers as well as different methods of creating footings 18. The invention is not limited to a particular embodiment, but extends to various modifications, combinations, and permutations that nevertheless fall within the scope and spirit of the appended claims.

What is claimed is:

1. A method of fabricating an integrated circuit, the method comprising:

providing a layer of silicon nitride over a semiconductor substrate, the layer of silicon nitride having a first thickness selected based on a desired size of extensions;

providing a layer of photoresist material over the layer of silicon nitride;

patterning the layer of photoresist to form photoresist features being separated at the top of the photoresist features by one minimum lithographic feature, wherein the photoresist features include extensions at the bottom of the photoresist features, the extensions defining footings with a width configured to reduce the separation at the bottom of the photoresist features, whereby exposed portions of the layer of silicon nitride are less than one minimum lithographic feature in width; and etching a portion of the layer of silicon nitride to form a hole for an integrated circuit device feature.

2. The method of claim 1, wherein the footings have a width which is a function of the thickness of the layer of silicon nitride.

3. The method of claim 1, wherein the spacing of the layer of silicon nitride exposed by the patterning step is smaller than one minimum lithographic feature.

4. The method of claim 1, wherein the step of patterning the layer of photoresist comprises selectively etching portions of the layer of photoresist.

5. The method of claim 1, wherein the first thickness comprises a thickness ranging from 5,000 to 12,000 Angstroms.

6. A method of fabricating an integrated circuit, the method comprising:

providing a layer of silicon nitride over a semiconductor substrate, the layer of silicon nitride having a first thickness selected based on a desired size of extensions;

providing a layer of photoresist material over the layer of silicon nitride;

patterning the layer of photoresist to form photoresist features being separated at the top of the photoresist features by one minimum lithographic feature, wherein the photoresist features include extensions at the bottom of the photoresist features, the extensions defining footings with a width configured to reduce the separation at the bottom of the photoresist features, whereby exposed portions of the layer of silicon nitride are less than one minimum lithographic feature in width; and etching a portion of the layer of silicon nitride to form a hole for an integrated circuit device feature, wherein the width of the footings is 500–1,000 Angstroms.

7. A method of fabricating an integrated circuit, the method comprising:

providing a layer of silicon nitride over a semiconductor substrate, the layer of silicon nitride having a first thickness selected based on a desired size of extensions;

providing a layer of photoresist material over the layer of silicon nitride;

patterning the layer of photoresist to form photoresist features being separated at the top of the photoresist features by one minimum lithographic feature, wherein the photoresist features include extensions at the bottom of the photoresist features, the extensions defining footings with a width configured to reduce the separation at the bottom of the photoresist features, whereby exposed portions of the layer of silicon nitride are less than one minimum lithographic feature in width; and etching a portion of the layer of silicon nitride to form a hole for an integrated circuit device feature, wherein the thickness of the layer of silicon nitride is 5,000 to 12,000 Angstroms.

8. A method of forming an integrated circuit device feature, the method comprising:

providing a silicon nitride layer having a thickness selected based on a desired size of extensions; and forming photoresist features over the silicon nitride layer, wherein the photoresist features include extensions and provide a mask for etching the silicon nitride layer at a width which is smaller than one minimum lithographic feature, wherein the extensions have a width selected to reduce the critical dimension patterned by the mask.

9. The method of claim 8, further comprising etching a portion of the silicon nitride layer to form an aperture for the integrated circuit device feature.

10. The method of claim 8, wherein the step of providing a silicon nitride layer comprises selectively depositing a thickness of silicon nitride corresponding to a desired size of extensions of the photoresist features.

11. The method of claim 8, wherein the step of providing a silicon nitride layer comprises depositing silicon nitride and selectively removing a portion of the silicon nitride to have a desired thickness.

12. A method of forming an integrated circuit device feature, the method comprising:

providing a silicon nitride layer having a thickness selected based on a desired size of extensions; and forming photoresist features over the silicon nitride layer, wherein the photoresist features include extensions and provide a mask for etching the silicon nitride layer at a width which is smaller than one minimum lithographic feature, wherein the extensions define footings having a width of 500 to 1,000 Angstroms.

13. A method of forming an integrated circuit device feature, the method comprising:

providing a silicon nitride layer having a thickness selected based on a desired size of extensions; and forming photoresist features over the silicon nitride layer, wherein the photoresist features include extensions and provide a mask for etching the silicon nitride layer at a width which is smaller than one minimum lithographic feature, wherein the thickness of silicon nitride is between 5,000 and 12,000 Angstroms.

14. A method of forming an integrated circuit device feature, the method comprising:

providing a silicon nitride layer having a thickness selected based on a desired size of extensions; and forming photoresist features over the silicon nitride layer, wherein the photoresist features include extensions and provide a mask for etching the silicon nitride layer at a width which is smaller than one minimum lithographic feature, wherein the thickness of silicon nitride is 12,000 Angstroms.

15. An integrated circuit manufactured by a method comprising:

providing a layer of silicon nitride over a semiconductor substrate, the layer of silicon nitride having a first thickness selected based on a desired size of extensions;

providing a layer of photoresist material over the layer of silicon nitride;

patterning the layer of photoresist to form photoresist features being separated at the top of the photoresist features by one minimum lithographic feature, wherein the photoresist features include extensions at the bottom of the photoresist features, the extensions defining footings which reduce the separation at the bottom of the photoresist features, whereby exposed portions of the layer of silicon nitride are less than one minimum lithographic feature in width; and etching a portion of the layer of silicon nitride to form a hole for an integrated circuit device feature.

16. The integrated circuit manufactured by the method of claim 15, wherein the footings have a width and the layer of silicon nitride has a thickness, the width of the footings being a function of the thickness of the layer of silicon nitride.

17. The integrated circuit manufactured by the method of claim 16, wherein the thickness of the layer of silicon nitride is 5,000 Angstroms.

18. The integrated circuit manufactured by the method of claim 15, further comprising filling the hole in the layer of silicon nitride with conductive material for form a contact.

19. The integrated circuit manufactured by the method of claim 15, further comprising filling the hole with a material to form a gate.

* * * * *